United States Patent
Farys et al.

(10) Patent No.: US 8,883,625 B2
(45) Date of Patent: Nov. 11, 2014

(54) METHOD FOR DECOMPOSING LINES OF AN ELECTRONIC CIRCUIT

(75) Inventors: Vincent Farys, Saint Martin d'Heres (FR); Emmanuelle Serret, Vaulnaveys le Haut (FR)

(73) Assignee: STMicroelectronics (Crolles 2) SAS, Crolles (FR)

(*) Notice: Subject to any disclaimer, the term of this patent is extended or adjusted under 35 U.S.C. 154(b) by 149 days.

(21) Appl. No.: 13/425,759

(22) Filed: Mar. 21, 2012

(65) Prior Publication Data

US 2012/0241975 A1 Sep. 27, 2012

(30) Foreign Application Priority Data

Mar. 24, 2011 (FR) .................................... 11 52463

(51) Int. Cl.
*H01L 21/82* (2006.01)
*H01L 21/44* (2006.01)
*H01L 23/528* (2006.01)
*H01L 27/02* (2006.01)
*G06F 17/50* (2006.01)
*H01L 21/033* (2006.01)

(52) U.S. Cl.
CPC .......... *H01L 23/528* (2013.01); *H01L 21/0337* (2013.01); *H01L 27/0207* (2013.01); *G06F 17/5081* (2013.01)
USPC .................... 438/599; 438/129; 438/671

(58) Field of Classification Search
CPC ................... H01L 21/768; H01L 21/76816
USPC ............................ 438/129, 599, 671
See application file for complete search history.

(56) References Cited

U.S. PATENT DOCUMENTS

| | | | | |
|---|---|---|---|---|
| 7,115,525 B2 * | 10/2006 | Abatchev et al. | ............ | 438/725 |
| 7,173,491 B2 * | 2/2007 | Bocock et al. | ............... | 330/285 |
| 8,043,915 B2 * | 10/2011 | Tran | ............... | 438/267 |
| 8,298,928 B2 * | 10/2012 | Yanagidaira et al. | ......... | 438/599 |
| 8,372,743 B2 * | 2/2013 | Blatchford | .................... | 438/622 |
| 8,461,038 B2 * | 6/2013 | Blatchford | .................... | 438/622 |
| 8,476,763 B2 * | 7/2013 | Kim et al. | ..................... | 257/741 |
| 8,487,423 B2 * | 7/2013 | Matsumura et al. | ......... | 257/691 |
| 8,575,020 B2 * | 11/2013 | Blatchford | .................... | 438/622 |
| 8,629,052 B2 * | 1/2014 | Park et al. | .................... | 438/612 |
| 2006/0019414 A1 | 1/2006 | Wang et al. | | |
| 2006/0211260 A1 | 9/2006 | Tran et al. | | |
| 2007/0210449 A1 * | 9/2007 | Caspary et al. | ............... | 257/734 |
| 2009/0111270 A1 * | 4/2009 | Choi | ............................. | 438/694 |
| 2009/0249275 A1 | 10/2009 | Gotou et al. | | |
| 2011/0285029 A1 * | 11/2011 | Tran | ............................. | 257/774 |
| 2012/0184106 A1 * | 7/2012 | Juengling | ....................... | 438/703 |
| 2013/0168827 A1 * | 7/2013 | Kodama et al. | ............... | 257/618 |
| 2014/0131879 A1 * | 5/2014 | Kodama et al. | ............... | 257/773 |

* cited by examiner

*Primary Examiner* — David Zarneke
(74) *Attorney, Agent, or Firm* — Allen, Dyer, Doppelt, Milbrath & Gilchrist, P.A.

(57) ABSTRACT

A method for defining parallel lines extending along a first direction in a same level of an integrated circuit, among which at least first and second lines separated by an even number of lines are interconnected, a space having a width at least equal to the minimum space between two lines separated by one line being left free, in a second direction perpendicular to the first direction, on either side of a minimum rectangle containing the first and the second lines.

8 Claims, 3 Drawing Sheets

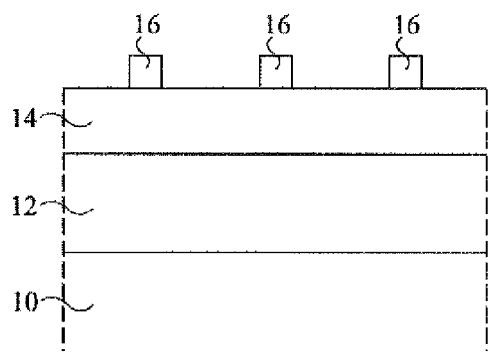
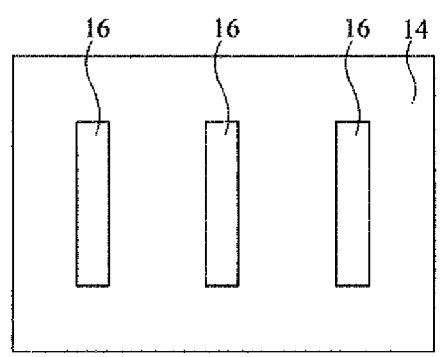
Fig 1A  Fig 1B
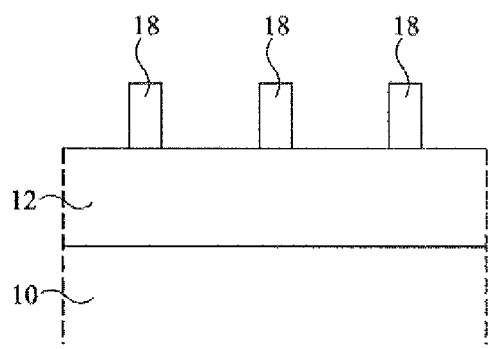
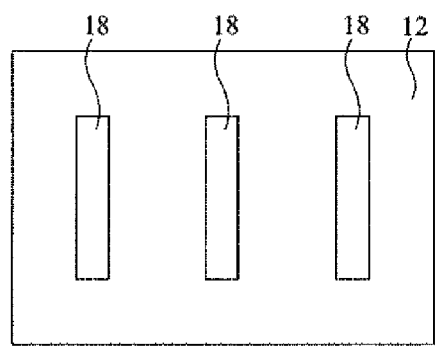
Fig 2A  Fig 2B
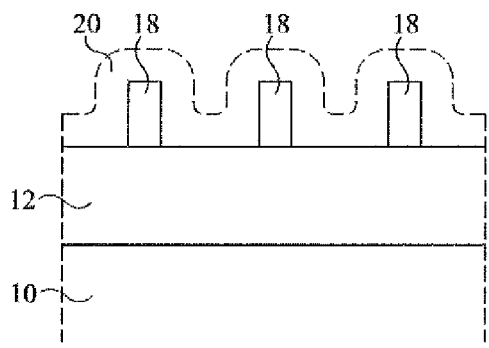
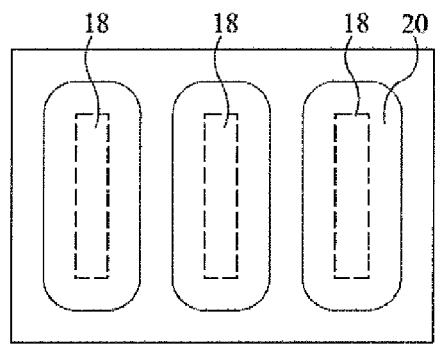
Fig 3A  Fig 3B
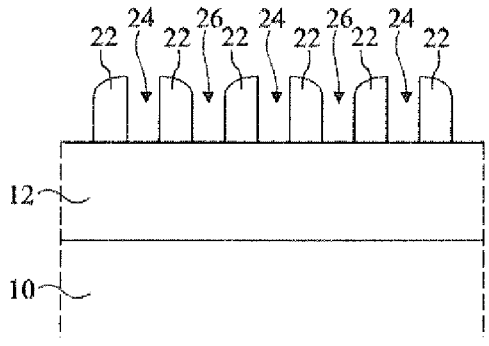
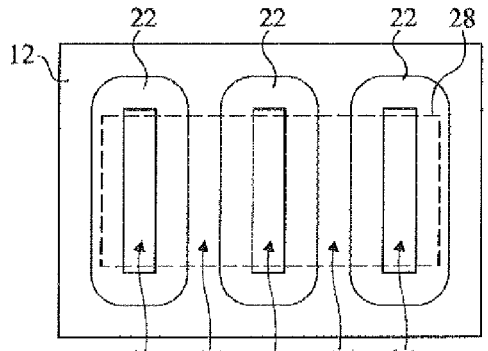
Fig 4A  Fig 4B

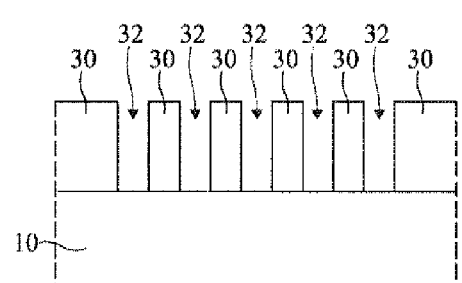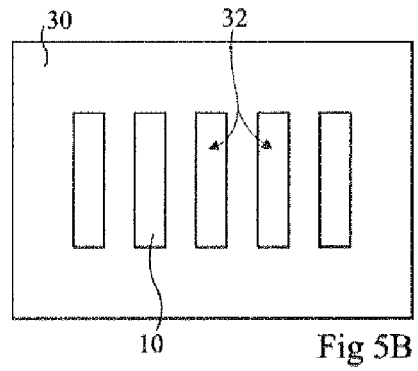
Fig 5A　　Fig 5B
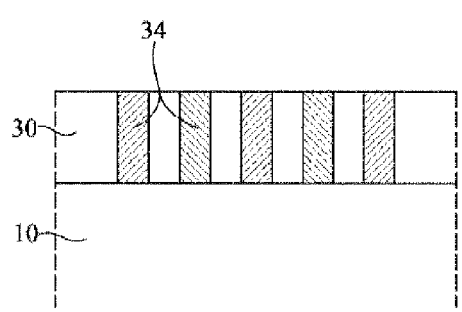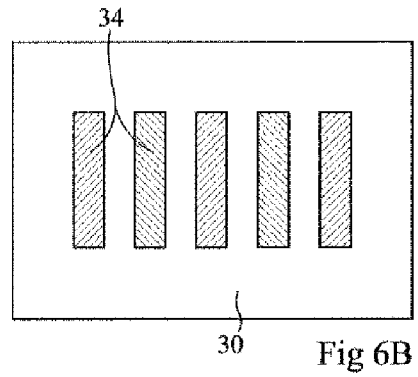
Fig 6A　　Fig 6B
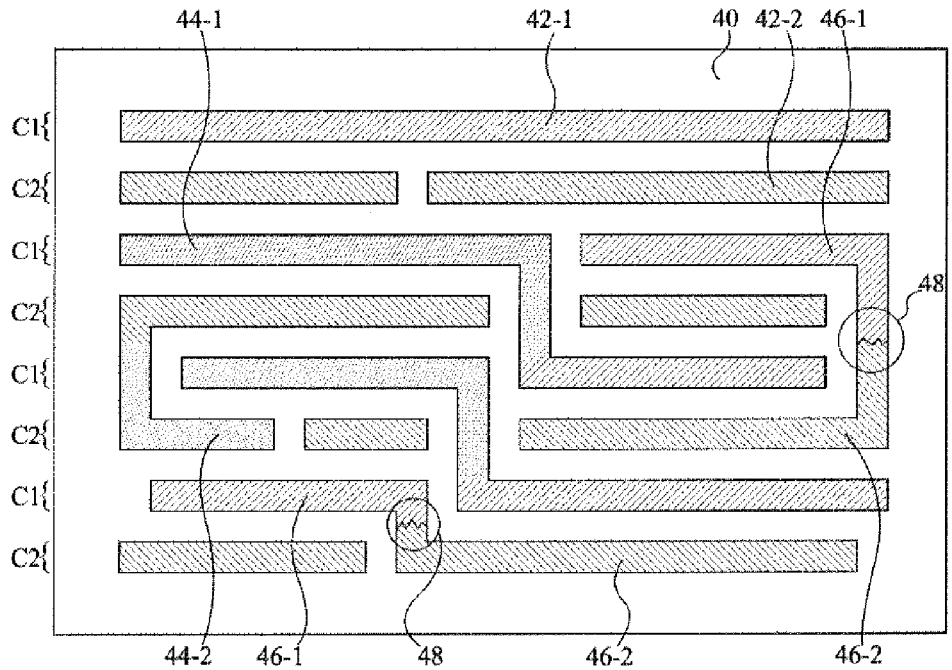
Fig 7

METHOD FOR DECOMPOSING LINES OF AN ELECTRONIC CIRCUIT

CROSS REFERENCE TO RELATED APPLICATION

This application is a translation of and claims the priority benefit of French patent application Ser. No. 11/52463 filed on Mar. 24, 2011, entitled "Method for decomposing lines of an electronic circuit," which is hereby incorporated by reference to the maximum extent allowable by law.

BACKGROUND OF THE INVENTION

1. Field of the Invention

The present invention relates to a method for defining lines in an integrated circuit level. More specifically, the present invention relates to a line decomposition method, compatible with any method for defining high-density lines used in integrated circuits. The present invention also relates to an integrated circuit comprising an interconnection level obtained by the disclosed manufacturing method.

2. Discussion of Prior Art

Many methods for defining lines in integrated circuit levels are known. Such methods may for example be used to define locations of etched area in which a conductive material is deposited to form tracks, for example, conductive interconnection tracks of an integrated circuit. They may also be used for the definition of any element formed in an integrated circuit and having a significant density, for example, transistor gates.

Generally, such methods comprise forming, at the surface of the area to be etched, an etch mask also called hard mask. A hard mask may for example be obtained by performing steps of photolithography of a resin deposited at the surface of a hard mask layer and then etching portions of the hard mask through the resin mask.

Once the hard mask has been formed, locations of conductive tracks and vias of an interconnection level may be etched, for example, by a damascene process, to then carry out a single step of deposition of a conductive material and form tracks and vias of a same level.

To obtain lines having a greater density, at the surface of a circuit, the density of the openings in the hard mask must be increased. However, current photolithography and hard mask etching techniques do not enable to form etched regions of an etch mask very close to one another. Indeed, openings defined in resin masks defined by photolithography, and thus in hard masks, cannot have dimensions smaller than a threshold defined by the methods for manufacturing these masks.

To solve this problem, it has been provided to form etched lines through a hard mask defined in several steps, for example, by carrying out two steps of etching through two resin masks defined by two separate photolithography steps: a first resin mask has openings corresponding to parallel lines of even rank, a second resin mask has openings corresponding to parallel lines of odd rank.

A disadvantage of the hard mask definition method implementing two steps of etching through two resin masks defined by two photolithography steps is that the resin masks must be perfectly aligned to obtain conformal line etchings. Indeed, a poor alignment between resin masks implies variable distances between lines, which may cause electric problems in the integrated circuit interconnection levels (in the case of lines filled with a conductive material). In practice, such an alignment is very difficult to obtain with a sufficient accuracy for the densest lines.

Other techniques for forming lines etched through an etch mask defined in two steps (known under acronym DPT, for Dual Patterning Technique) have been provided. One of these techniques is known as the SIT, for Sidewall Image Transfer.

FIGS. 1A to 6A, respectively 1B to 6B, illustrate in cross-section views, respectively in top views, steps of a method for defining lines etched through an etch mask defined in two steps, of SIT type.

At the step illustrated in FIGS. 1A and 1B, it is started from a device comprising a support 10 at the surface of which a layer 12 in which lines are desired to be defined is provided. On layer 12 is formed a sacrificial layer 14, having, provided at its surface, resin pads 16 previously etched by photolithography so that they correspond to a first set of lines which are desired to be defined in layer 12.

At the step illustrated in FIGS. 2A and 2B, sacrificial layer 14 is etched through resin pads 16, which forms pads 18 at the surface of layer 12. Resin 16 is then removed.

At the step illustrated in FIGS. 3A and 3B, a layer 20 of a material selectively etchable over layer 12 and over portions 18 is conformally formed over the entire device.

At the step illustrated in FIGS. 4A and 4B, conformal layer 20 has been anisotropically etched so that it only leaves portions forming spacers 22 along portions 18. Exposed portions 18 are then removed.

An etch mask defining a first set of openings 24 at the location of portions 18 and a second set of openings 26 at the level of portions where layer 20 has been removed from the surface of layer 12 to be etched is then obtained at the surface of layer 12 to be etched.

At the step illustrated in FIGS. 5A and 5B, and etch (transfer) step has been carried out. This step comprises etching layer 12 through the etch mask defined by portions 22. Layer 12 is etched at the level of openings 24 and 26.

To properly define the ends of the lines, the etching of layer 12 is performed through a mask 28 (see FIG. 4B) having its contour corresponding to the ends of the lines which are desired to be defined. The stopping of the line etching may also be obtained by other techniques.

At the step illustrated in FIGS. 6A and 6B, trenches 32 have been filled with a conductive material 34 to form conductive tracks. In FIGS. 6A and 6B, tracks 34 formed in front of openings 24 and tracks 34 formed in front of openings 26 have been shown with hatchings. Indeed, it is generally considered that lines 32 obtained at the level of openings 24 and 26 (formed at two different steps of the method for defining the hard etch mask) are not associated with a same step of definition of the hard mask, and thus, by extension, that there are "two" steps of line definition (although the final transfer is performed at the same time for all lines). It is also currently spoken of different colors for tracks 34 associated with openings 24 and tracks 34 associated with openings 26.

In the following description, this color terminology will be used to designate, with a first color, all the lines or tracks defined in front of openings 24 and, with a second color, all the lines or tracks defined in front of openings 26.

This color terminology similarly applies to any etch mask definition method of DPT (Dual Patterning Technique) type, or to methods implementing two steps of resin mask definition by photolithography to form the hard etch mask. Thus, lines of a first color, respectively of a second color, are lines corresponding to openings formed in the etch/transfer mask in a first step, respectively in a second step, of definition of the etch/transfer mask.

Thus, when a line pattern is defined, it is necessary to perform a step of "coloring" of the different lines or line portions to assign them a color and ensure their practical forming.

FIG. 7 illustrates a disadvantage of a dual DPT-type etching method or of a double photolithography method, for example, of the method described in relation with FIGS. 1A to 6A and 1B to 6B, in the case of specific lines.

In FIG. 7, an assembly of conductive tracks of two colors (two types of hatchings) is shown at the surface of a support 40. The tracks of a first color correspond to a first etch mask definition step and the tracks of a second color correspond to a second etch mask definition step.

The use of DPT-type methods, or of methods of etch mask definition by double photolithography, implies that lines of different colors are alternately formed at the surface of support 40 (lines C1 for the first color, C2 for the second color).

In the example of FIG. 7, tracks 42-1 (on a line C1) and 42-2 (on a line C2) extend at the surface of structure 40 along one line only (one-dimensional structure, 1D). Other tracks 44-1, 44-2, are formed of two portions located in different lines, but of same rank (C1 or C2), connected by perpendicular connection tracks (two-dimensional structure, 2D). In this case, the connection track is formed during the same step as that defining the parallel line portions to be connected.

A coloring issue 48 arises when a line portion 46-1 located on a line of even rank C1 is desired to be connected to a line portion 46-2 located on a line of odd rank C2 (specific 2D structure).

To overcome this problem, a manual adjustment of the line pattern may be provided, to locally modify the line positioning in problem areas. However, a manual adjustment cannot be envisaged at the scale of a complex finite electronic circuit.

Another solution would be to forbid 2D structures which raise issues, that is, which have their two parallel portions separated by an even number of lines. This solution however implies using other means to connect these two lines, for example, in the case of a stack of integrated circuit interconnection levels, by running through an adjacent interconnection level and by forming conductive vias. This may however complicate the system manufacturing, or further decrease the track density.

There is a need for a line definition method overcoming the above-mentioned problems of connection between lines of an assembly of parallel lines defined in an integrated circuit. There thus is a need for a method for defining lines capable of being colored.

SUMMARY OF THE INVENTION

An embodiment provides a method for defining high-density lines in an integrated circuit level, overcoming all or part of the disadvantages of prior art methods.

Another embodiment provides a method for defining lines in an integrated circuit level, compatible with any known line etching method.

Another embodiment provides an integrated circuit having at least one level with lines defined by such a method.

Thus, an embodiment provides a method for defining parallel lines extending along a first direction in a same level of an integrated circuit, among which at least one first and one second lines separated by an even number of lines are interconnected, a space having a width at least equal to the minimum space between two lines separated by one line being left free, in a second direction perpendicular to the first direction, on either side of a minimum rectangle containing the first and the second lines.

According to an embodiment, the minimum interval between lines is equal to the line width.

According to an embodiment, a minimum interval, in the first direction, is further provided between two portions formed on a same line.

According to an embodiment, each line further has a length, in the first direction, greater than a minimum length.

An embodiment further provides a method for manufacturing an integrated circuit level comprising etched lines having a shape defined by the above method.

According to an embodiment, the etched lines are filled with a conductive material to form conductive tracks.

According to an embodiment, the etched lines are formed through an etch mask having its contour defined in two lithography steps.

According to an embodiment, the etched lines are formed through an etch mask having its contour defined by a step of lithography of a sacrificial layer, a step of conformal deposition of a spacing layer, a step of anisotropic etching of the spacing layer, and a step of etching of remaining portions of the sacrificial layer.

An embodiment further provides an integrated circuit comprising an interconnection level obtained by the above manufacturing method.

The foregoing and other benefits will be discussed in detail in the following non-limiting description of specific embodiments in connection with the accompanying drawings.

BRIEF DESCRIPTION OF THE DRAWINGS

FIGS. 1A, 2A, 3A, 4A, 5A, and 6A, respectively 1B, 2B, 3B, 4B, 5B, and 6B, are side views, respectively top views, of results of steps of a known method for forming lines through an etch mask defined in two steps;

FIG. 7 illustrates an issue associated with known methods of line manufacturing in an integrated circuit level;

For clarity, the same elements have been designated with the same reference numerals in the different drawings and, further, as usual in the representation of integrated circuits, the various drawings are not to scale.

DETAILED DESCRIPTION

To overcome all or part of the disadvantages of known line definition methods, the present inventors have looked for a rule of definition of one- or two-dimensional lines in an integrated circuit level adapted to any subsequent line manufacturing method, and especially to methods with a double step of definition of the line etching mask.

To form lines in a same integrated circuit level, it is generally provided to impose, at the surface of the circuit level, a number of rules so that the line definition, be it by etching or by any other method, occurs smoothly in practice.

Figure 8:
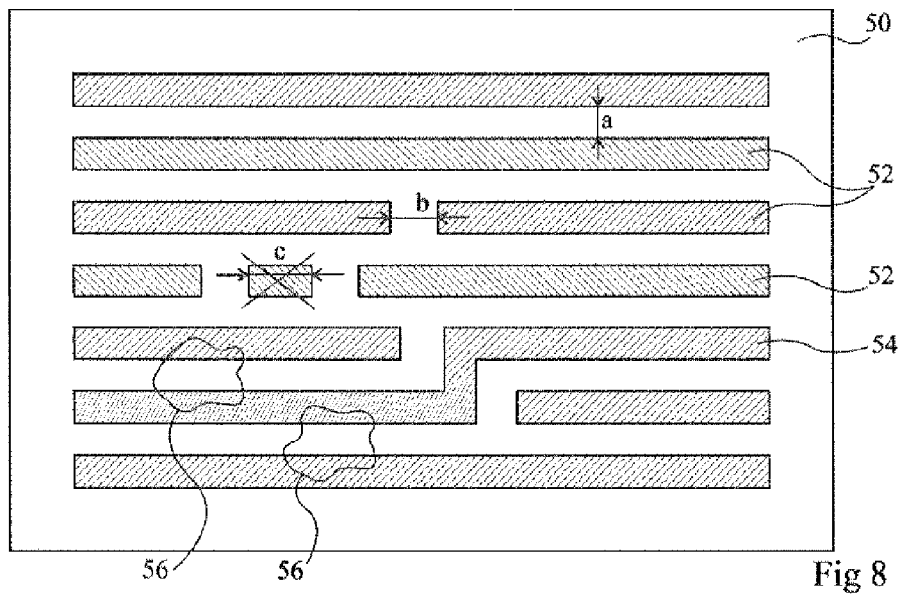
FIG. 8 illustrates a solution poorly adapted to the issue raised by FIG. 7.

FIG. 8 illustrates examples of such line definition rules in the case of a two-color structure and shows a case of critical two-dimensional (2D) line structure, the 2D structure being formed, in this case, of a portion of a single color. FIG. 8 shows an assembly of regularly-distributed parallel lines 52 formed at the surface of a support 50.

Among the examples of rules of line definition in a conventional integrated circuit level, a first rule setting a minimum space between two adjacent lines ("a" in FIG. 8), a second rule setting a minimum space between two line ends of a same line ("b" in FIG. 8), or again a third rule imposing a minimum line length ("c" in FIG. 8) can be mentioned.

FIG. 8 shows a two-dimensional line 54 of a single color connecting two neighboring lines, the lines located around line 54 respecting the conventional color alternation of etch methods. In this case, a problem is posed in the vicinity of the two parallel portions forming line 54 (outlined areas in FIG. 8). Indeed, in this case, the portions of line 54 located in the vicinity of other lines have the same color as line 54, which is incompatible with methods of line forming by means of an etch mask having its contour formed in two steps.

To solve such "coloring" problems, it is provided to insert, in the method for defining different lines in a same integrated circuit level, an additional rule compatible with the methods of etch mask definition by two different steps, but also with any method enabling to form an assembly of parallel lines, regularly distributed and of high density in a same integrated circuit level. This general condition is thus advantageously compatible, for example, with any known line etching method.

Figure 9A:
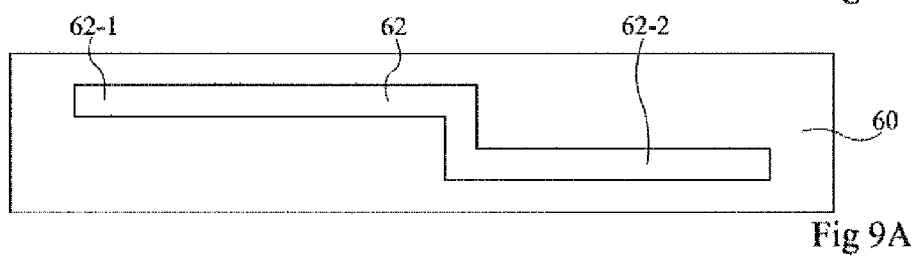
FIGS. 9A to 9C illustrate a method for defining lines in an integrated circuit level according to an embodiment.
Figure 9B:
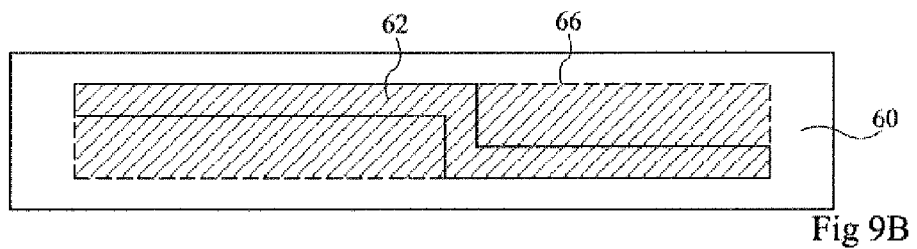

This rule is illustrated in relation with FIGS. 9A to 9B.

In FIG. 9A, a line 62 comprising two parallel line portions (62-1 and 62-2) connected by a connection line (2D structure) perpendicular thereto is formed at the surface of the considered level 60. The two parallel portions of track 62 are separated by an even number of tracks (in the present case, there are next to each other). It should be noted that the line definition method defined herein applies to any line connecting two parallel line portions distant by an even number of lines.

As illustrated in FIG. 9B, a minimum rectangular surface area 66 containing line 60 is defined.

Figure 9C:
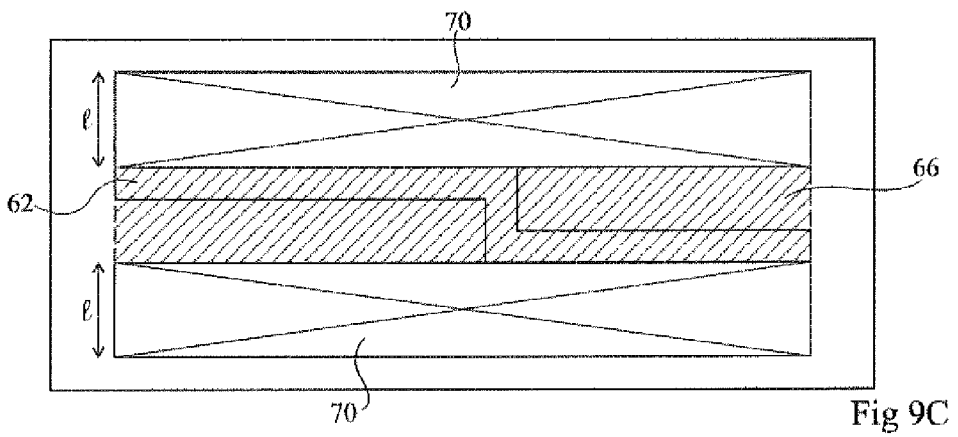

Then, as illustrated in FIG. 9C, an area 70 is defined on either side of surface 66 in a direction perpendicular to that of the parallel portions forming line 62. This area has a width 1, in the direction of its definition, at least equal to the spacing between two lines of same color. In the specific case of an SIT-type line manufacturing method, width 1 is thus at least equal to the width of a line to which twice the minimum interval between lines is added. More generally, for any line definition method, width 1 is at least equal to the minimum space between two lines separated by one line. This space may be for example associated with the dimensional photolithography mask definition limits.

Lines are defined parallel to each other at regular intervals. In another wording, the first adjacent line of line 62 is formed at least at twc intervals from parallel portions defining line 62, on each side of the rectangular surface area 66, that is on each side of lines on which portions of line 62 are defined.

The definition method provides, to avoid any conflict at the coloring or manufacturing of the lines, for area 70 to be left free of any other line.

It should be noted that this rule does not apply to the case where the interconnected lines are separated, in a direction perpendicular to their length, by an odd number of lines, this case raising no problem in the case of a definition of lines of different colors (see FIG. 7).

Advantageously, this general condition, added to the rules of line sizing in conventional integrated circuits (minimum space between neighboring lines, minimum space between two opposite line ends, width and length of the different lines) enables to avoid coloring problems, but also adapts for any line definition method.

In a specific case where the minimum interval between two etched lines is equal to the line width, area 70 has a width, in a direction perpendicular to the parallel portions of the lines, greater than or equal to the spacing between two lines of same color (more generally greater than or equal to the spacing between two lines separated by one line). Thus, in the specific case of a method for manufacturing SIT-type lines, area 70 has a width greater than or equal to three times the line width.

Advantageously, the definition of line-free area 70 only slightly decreases the line density at the surface of the integrated circuit level, which enables to keep a high line density per interconnection level.

Specific embodiments of the present invention have been described. Various alterations and modifications will occur to those skilled in the art. In particular, the line definition method provided herein may apply on a level of an integrated circuit interconnection stack to define conductive tracks, but also on several or on all the integrated circuit levels, the conductive tracks of the different levels being then interconnected by conductive vias (3D structure).

Further, although the method described herein advantageously applies to the definition of lines which are then etched to define conductive tracks of interconnection stacks, it may also apply to any method requiring the definition of a dense assembly of parallel lines in an integrated circuit level, to suppress any conflict on manufacturing of the lines. In particular, it for example applies to the definition of polysilicon gates of transistors or of any other integrated circuit element requiring a high density.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for defining a plurality of parallel lines extending in a first direction in a same level of an integrated circuit at regular intervals, comprising:
   forming a first parallel line portion;
   forming a second parallel line portion at an uneven number of intervals from the first parallel line portion, wherein:
      the first parallel line portion and the second parallel line portion are interconnected in the same level; and
      a rectangular surface area defined by the first parallel line portion and the second parallel line portion is separated from any other line of the plurality of lines by at least two intervals.

2. The method of claim 1, wherein a minimum distance (a) between any two lines of the plurality of parallel lines is equal to a width of the first parallel line portion.

3. The method of claim 1, further comprising:
   providing at least a predetermined minimum distance (b), in the first direction, between first and second adjacent portions of a single parallel line from among the plurality of parallel lines.

4. The method of claim 1, wherein each of the plurality of parallel lines comprises a length, in the first direction, greater than or equal to a predetermined minimum length (c).

5. A method for manufacturing an integrated circuit level comprising:
   etching a plurality of parallel lines extending in a first direction in the integrated circuit level at regular intervals, wherein the plurality of parallel lines are defined according to:
      forming a first parallel line portion;
      forming a second parallel line portion at an uneven number of intervals from the first parallel line portion, wherein:
         the first parallel line portion and the second parallel line portion are interconnected in the same level; and a rectangular area defined by the first parallel line portion and the second parallel line portion is separated from any other line of the plurality of lines by at least two intervals.

6. The method of claim 5, further comprising:
filling the etched lines with a conductive material to form conductive tracks.

7. The method of claim 5, wherein the etched lines are formed through an etch mask having its contour defined in two lithography steps.

8. The method of claim 5, wherein the etched lines are formed through an etch mask having its contour defined by a step of lithography of a sacrificial layer, a step of conformal deposition of a spacing layer, a step of anisotropic etching of the spacing layer, and a step of etching of remaining portions of the sacrificial layer.

* * * * *